(12) United States Patent  
Oh et al.

(10) Patent No.: US 8,598,943 B2  
(45) Date of Patent: Dec. 3, 2013

(54) SEMICONDUCTOR INTEGRATED CIRCUIT WITH STABLE RUPTURE VOLTAGE FUSE

(75) Inventors: Sang Mook Oh, Icheon-si (KR); Jae Hyuk Im, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 33 days.

(21) Appl. No.: 13/219,636

(22) Filed: Aug. 27, 2011

(65) Prior Publication Data

US 2012/0249221 A1 Oct. 4, 2012

(30) Foreign Application Priority Data

Mar. 28, 2011 (KR) ........................ 10-2011-0027575

(51) Int. Cl.
*H01H 37/76* (2006.01)
(52) U.S. Cl.
USPC ........................................... 327/525; 327/526
(58) Field of Classification Search
USPC ................... 327/525, 526; 365/225.7
See application file for complete search history.

(56) References Cited

U.S. PATENT DOCUMENTS

| | | | | |
|---|---|---|---|---|
| 5,144,578 A | * | 9/1992 | Sakagami | 365/63 |
| 5,712,577 A | * | 1/1998 | Cho | 326/38 |
| 6,144,247 A | * | 11/2000 | Kim et al. | 327/525 |
| 6,150,864 A | * | 11/2000 | Yach et al. | 327/288 |
| 6,657,531 B2 | * | 12/2003 | Kimura et al. | 337/167 |
| 6,680,873 B2 | * | 1/2004 | Muraoka et al. | 365/225.7 |
| 7,035,158 B2 | * | 4/2006 | Kozuka | 365/225.7 |
| 7,050,349 B2 | * | 5/2006 | Tanizaki | 365/225.7 |
| 7,349,281 B2 | * | 3/2008 | Kouchi et al. | 365/225.7 |
| 7,376,036 B2 | * | 5/2008 | Ueda | 365/225.7 |
| 7,394,713 B2 | * | 7/2008 | Knopf et al. | 365/225.7 |
| 7,394,715 B1 | * | 7/2008 | Tseng | 365/230.03 |
| 7,551,497 B2 | * | 6/2009 | Yuan | 365/189.11 |
| 7,932,738 B1 | * | 4/2011 | Banerjee et al. | 324/762.01 |
| 8,299,845 B2 | * | 10/2012 | Ishikawa | 327/525 |
| 8,305,826 B2 | * | 11/2012 | Banerjee et al. | 365/225.7 |
| 2009/0284310 A1 | * | 11/2009 | Koyama et al. | 327/564 |
| 2010/0109683 A1 | * | 5/2010 | Nishioka | 324/691 |

FOREIGN PATENT DOCUMENTS

| | | |
|---|---|---|
| KR | 1019990076398 A | 10/1999 |
| KR | 1020000050770 A | 8/2000 |
| KR | 10-0594204 B1 | 6/2006 |
| KR | 10-2011-0006238 A | 1/2011 |

* cited by examiner

*Primary Examiner* — Thomas J Hiltunen
(74) *Attorney, Agent, or Firm* — William Park & Associates Patent Ltd.

(57) ABSTRACT

A semiconductor integrated circuit includes a fuse set; a terminal assigned to be applied with a first external signal in a normal operation; and a control unit configured to receive a second external signal through the terminal and apply the received second external signal to the fuse set in a fuse control operation.

27 Claims, 10 Drawing Sheets

SEMICONDUCTOR INTEGRATED CIRCUIT WITH STABLE RUPTURE VOLTAGE FUSE

CROSS-REFERENCES TO RELATED APPLICATION

The present application claims priority under 35 U.S.C. §119(a) to Korean application number 10-2011-0027575, filed on Mar. 28, 2011, in the Korean Intellectual Property Office, which is incorporated herein by reference in its entirety as set forth in full.

BACKGROUND

1. Technical Field

The present invention relates generally to a semiconductor circuit, and more particularly, to a semiconductor integrated circuit.

2. Related Art

In general, a semiconductor integrated circuit employs fuses is which are used to change various setting values, perform repair operations, and so on.

A fuse used in a semiconductor integrated circuit may be a laser fuse which is cut using a laser.

On the other hand, the fuse used in the semiconductor integrated circuit may be an electronic fuse of which an electrical characteristics is changed by applying a high voltage.

Figure 1:
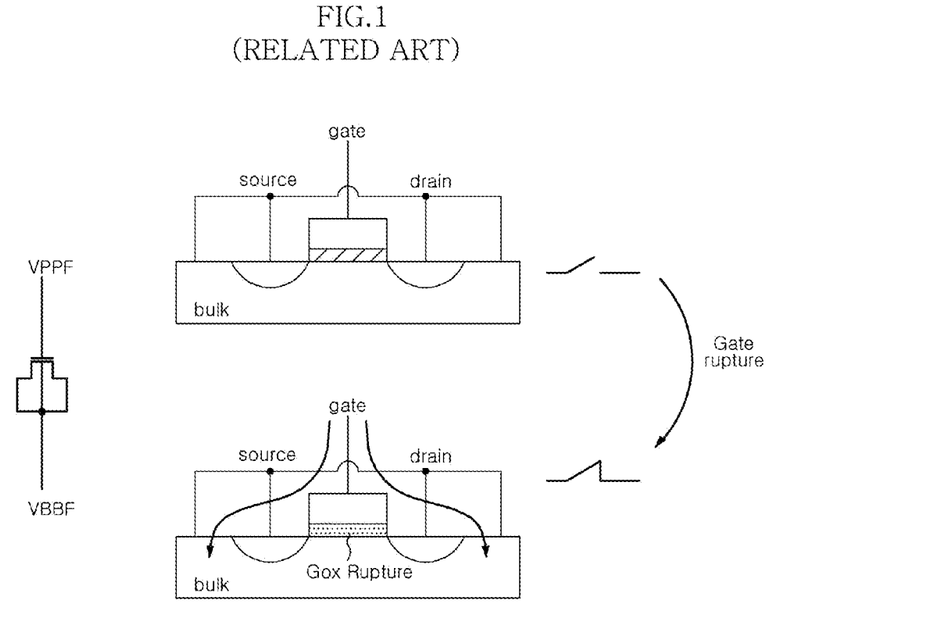
FIG. 1 is a cross-sectional view illustrating a known electronic fuse.

Referring to FIG. 1, an electronic fuse includes an anti-fuse.

The anti-fuse starts with a high resistance and is designed to create an electrically conductive path. For example, rupture bias voltages are applied to a source, a drain and a gate commonly connected with one another to rupture a gate oxide Gox so that the gate, the source, the drain and a bulk are connected with one another.

According to a known art, voltages VPPF and VBBF with a large voltage difference are applied to both ends of the fuse as the rupture bias voltages.

While a laser cutting type fuse cannot be used after packaging, the electronic fuse may be used, e.g., may be electrically cut or connected even after packaging.

For such an electronic fuse, a circuit for generating the rupture bias voltages may be included in the semiconductor integrated circuit, e.g., in a circuit configuration in which the electronic fuse is formed, or the rupture bias voltages may be provided from an external equipment.

Figure 2:
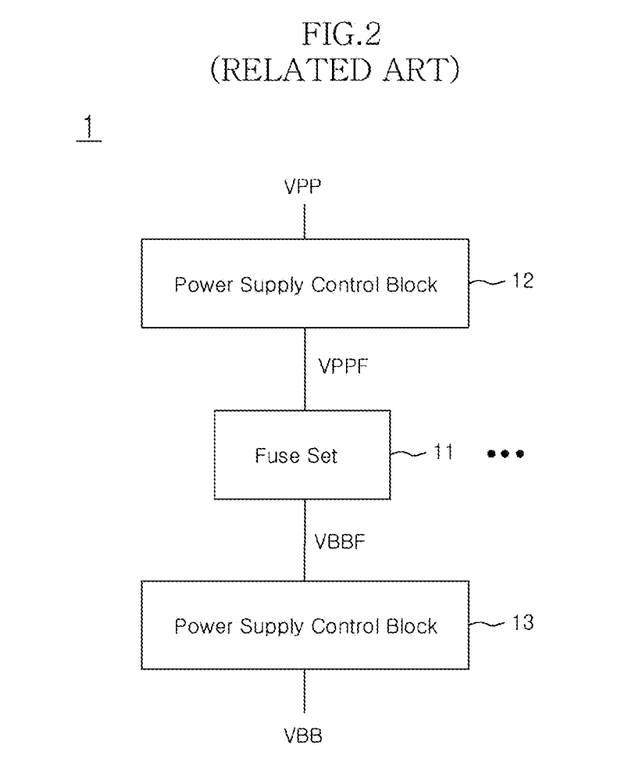
FIG. 2 is a block diagram showing a known semiconductor integrated circuit.

Referring to FIG. 2, a known semiconductor integrated circuit 1 is configured to generate rupture bias voltages therein.

The semiconductor integrated circuit 1 includes power supply control blocks 12 and 13 and a fuse set 11.

The fuse set 11 may be provided in a plural number, and each fuse set 11 may include a plurality of electronic fuses.

The power supply control blocks 12 and 13 generate rupture bias voltages VPPF and VBBF using internal power sources VPP and VBB, respectively.

Here, the internal power sources VPP and VBB are power sources which are internally generated by a VPP pump (not shown) and a VBB pump (not shown), respectively.

In this regard, in the case where the rupture bias voltages VPPF and VBBF are generated using the internal power sources VPP and VBB, when compared to the case where the rupture bias voltages VPPF and VBBF are not generated internally using the internal power sources VPP and VBB, an increased number of charge pumps are needed. As a consequence, a circuit area increases, and it may be difficult to supply precise and stable rupture bias voltages.

Figure 3:
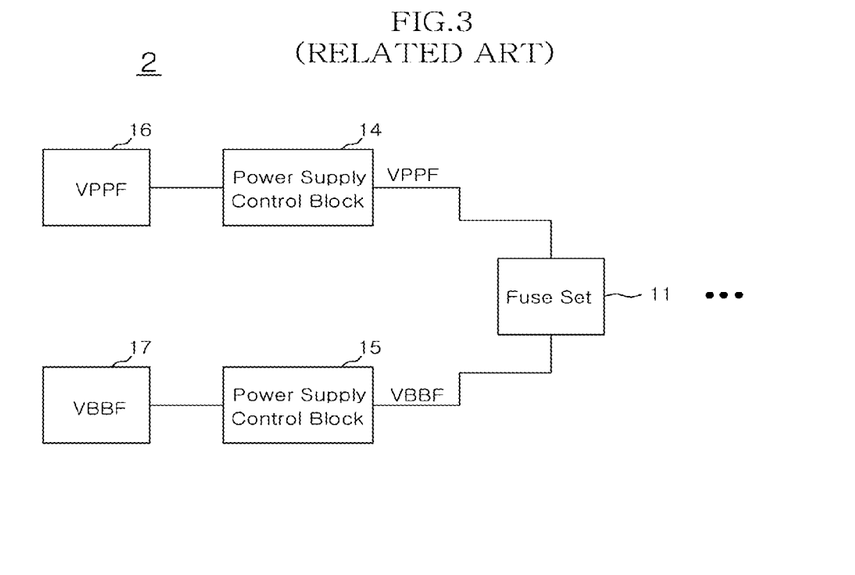
FIG. 3 is a block diagram showing another known semiconductor integrated circuit.

Referring to FIG. 3, a known semiconductor integrated circuit 2 is configured to receive rupture bias voltages VPPF and VBBF from an external test equipment.

The semiconductor integrated circuit 2 includes dedicated terminals 16 and 17 for rupture biases, power supply control blocks 14 and 15, and a fuse set 11.

The dedicated terminals 16 and 17 for rupture biases are configured not to be used in a normal operation but to receive the rupture bias voltages VPPF and VBBF from the external test equipment only in a fuse rupture operation.

The dedicated terminals 16 and 17 for rupture biases may be package balls of an FBGA (fine ball grid array) or pads.

Also, the power supply control blocks 14 and 15 provide the rupture bias voltages VPPF and VBBF supplied through the dedicated terminals 16 and 17 for rupture biases, to the fuse set 11.

However, due to the area of the dedicated terminals 16 and 17, the size of the semiconductor integrated circuit may increase, and a circuit design related with power supply terminals may become complicated.

SUMMARY

A semiconductor integrated circuit which can supply stable rupture bias voltages and reduce the area of and improve the design efficiency of a circuit associated with power supply terminals is described herein.

In an embodiment of the present invention, a semiconductor integrated circuit includes: a fuse set; a terminal assigned to be applied with a first external signal in a normal operation; and a control unit configured to receive a second external signal through the terminal and apply the received second external signal to the fuse set in a fuse control operation.

In an embodiment of the present invention, a semiconductor integrated circuit includes: a fuse set; a first terminal assigned to be applied with a first external signal in a normal operation; a first control unit configured to receive a second external signal through the first terminal and apply the received second external signal to the fuse set in a fuse rupture operation; a second terminal assigned to be applied with a third external signal in the normal operation; and a second control unit configured to receive a fourth external signal through the second terminal and apply the received fourth external signal to the fuse set in the fuse rupture operation.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described below with reference to the accompanying drawings through exemplary embodiments.

In an embodiments of the present invention, dedicated terminals for rupture bias voltages are not used, and instead, through terminals assigned for a normal operation, first external signals are received in a normal operation and second external signals are received in a fuse control operation, e.g., a fuse rupture operation, to be applied to a selected fuse.

Embodiments of the present invention exemplify the case of using terminals which are assigned for a normal operation and are not used in a test operation, and in particular, exemplify the case of using terminals which receive reference voltages as the first external is signals.

Also, Embodiments of the present invention exemplify the case in which rupture bias voltages are supplied as second external signals.

Here, the reference voltages may be used for determining the respective values of data and an address inputted to a semiconductor integrated circuit.

Figure 4:
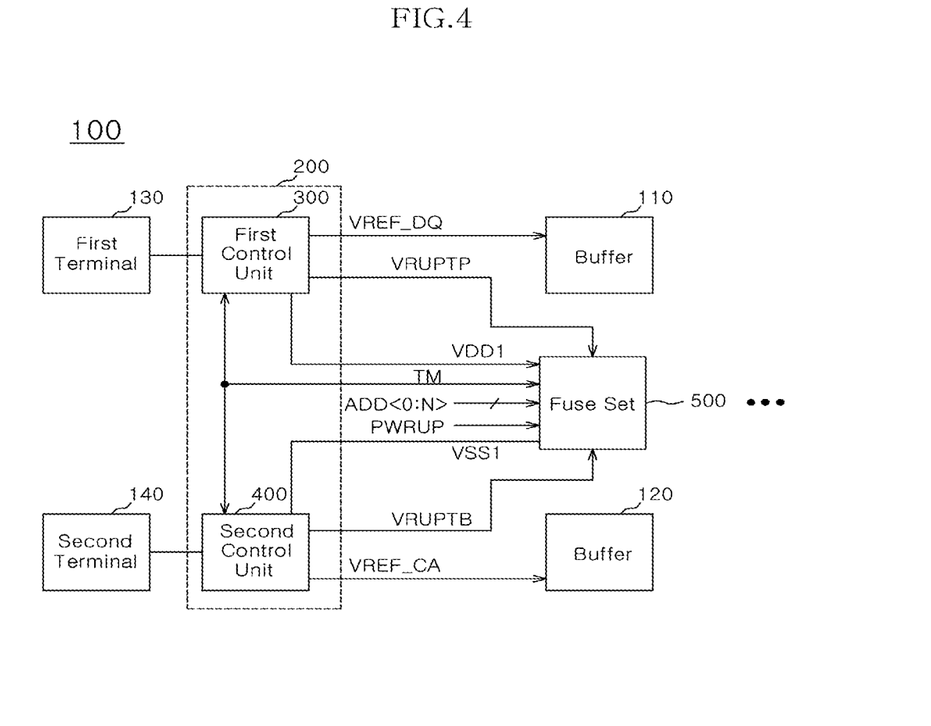
FIG. 4 is a block diagram showing a semiconductor integrated circuit in accordance with an embodiment of the present invention.

FIG. 4 is a block diagram showing a semiconductor integrated circuit in accordance with an embodiment of the present invention.

Referring to FIG. 4, a semiconductor integrated circuit 100 in accordance with an embodiment of the present invention includes first and second terminals 130 and 140, a control unit 200, and a fuse set 500.

The first terminal 130 receives a voltage from a controller which is electrically connected with the semiconductor integrated circuit 100 in a normal operation. In the normal operation, the controller may provide a first reference voltage VREF_DQ with a preset level (for example, VDD/2) to the first terminal 130.

The first terminal 130 may be provided with a voltage from a test equipment in a fuse rupture operation. In the fuse rupture operation, the test equipment may provide a first rupture bias voltage VRUPTP which has a different level from a voltage level of an operation voltage in the normal operation, e.g., the same level as the rupture bias voltage VPPF described above with reference to FIG. 3, to the first terminal 130.

The second terminal 140 receives a voltage from the controller which is electrically connected with the semiconductor integrated circuit 100 in the normal operation. In the normal operation, the controller may provide a second reference voltage VREF_CA with a preset level (for example, VDD/2) to the second terminal 140.

The second terminal 140 may be provided with a voltage from the test equipment in the fuse rupture operation. In the fuse rupture operation, the test equipment may provide a second rupture bias voltage VRUPTB which has a different level from a voltage level of an operation voltage in the normal operation, e.g., the same level as the rupture bias voltage VBBF described above with reference to FIG. 3, to the second terminal 140.

The control unit 200 is configured to couple the first and second terminals 130 and 140 to the fuse set 500 in response to a test mode signal TM.

According to an example, the control unit 200 electrically connects the first and second terminals 130 and 140 with the fuse set 500 in response to activation of the test mode signal TM.

Also, the control unit 200 electrically connects the first and second terminals 130 and 140 with buffers 110 and 120, respectively, in response to deactivation of the test mode signal TM.

The control unit 200 may include a first control unit 300 and a second control unit 400.

The first control unit 300 is configured to provide the first rupture bias voltage VRUPTP inputted through the first terminal 130, to the fuse set 500 in response to the test mode signal TM.

According to an example, the first control unit 300 is configured to provide a first reference voltage VREF_DQ inputted through the first terminal 130, to the buffer 110 in response to the deactivation of the test mode signal TM.

Also, the first control unit 300 may be configured to generate an internal voltage VDD1 and provide the generated internal voltage VDD1 to the fuse set 500.

According to an example, the second control unit 400 is configured to provide the voltage inputted through the second terminal 140, to the fuse set 500 as the second rupture bias voltage VRUPTB in response to the activation of the test mode signal TM.

Also, the second control unit 400 is configured to provide a second reference voltage VREF_CA inputted through the second terminal 140, to the buffer 120 in response to the deactivation of the test mode signal TM.

Further, the second control unit 400 may be configured to generate an internal voltage VSS1 and provide the generated internal voltage VSS1 to the fuse set 500.

The first rupture bias voltage VRUPTP may have a level higher than a pumping voltage VPP. The second rupture bias voltage VRUPTB may be a negative voltage which has a level lower than a bulk bias voltage VBB.

The first and second rupture bias voltages VRUPTP and VRUPTB may have the same levels as the rupture bias voltages VPPF and VBBF described above with reference to FIG. 3.

The fuse set 500 may be provided in a plural number, and each fuse set 500 may include a plurality of electronic fuses.

The fuse set 500 is configured to receive the test mode signal TM, fuse address signals ADD<0:N>, a power-up signal PWRUP, the first and second rupture bias voltages VRUPTP and VRUPTB, and the internal voltages VDD1 and VSS1.

The fuse set 500 is configured to apply the first and second rupture bias voltages VRUPTP and VRUPTB to a selected fuse in response to the fuse address signals ADD<0:N>, and change the state of the fuse.

The fuse set 500 is configured to block supply of the first and second rupture bias voltages VRUPTP and VRUPTB to unselected fuses according to the fuse address signals ADD<0:N>.

The buffers 110 and 120 buffer and provide the reference voltages VREF_DQ and VREF_CA to circuit components (not shown) which are to receive data and addresses.

Figure 5:
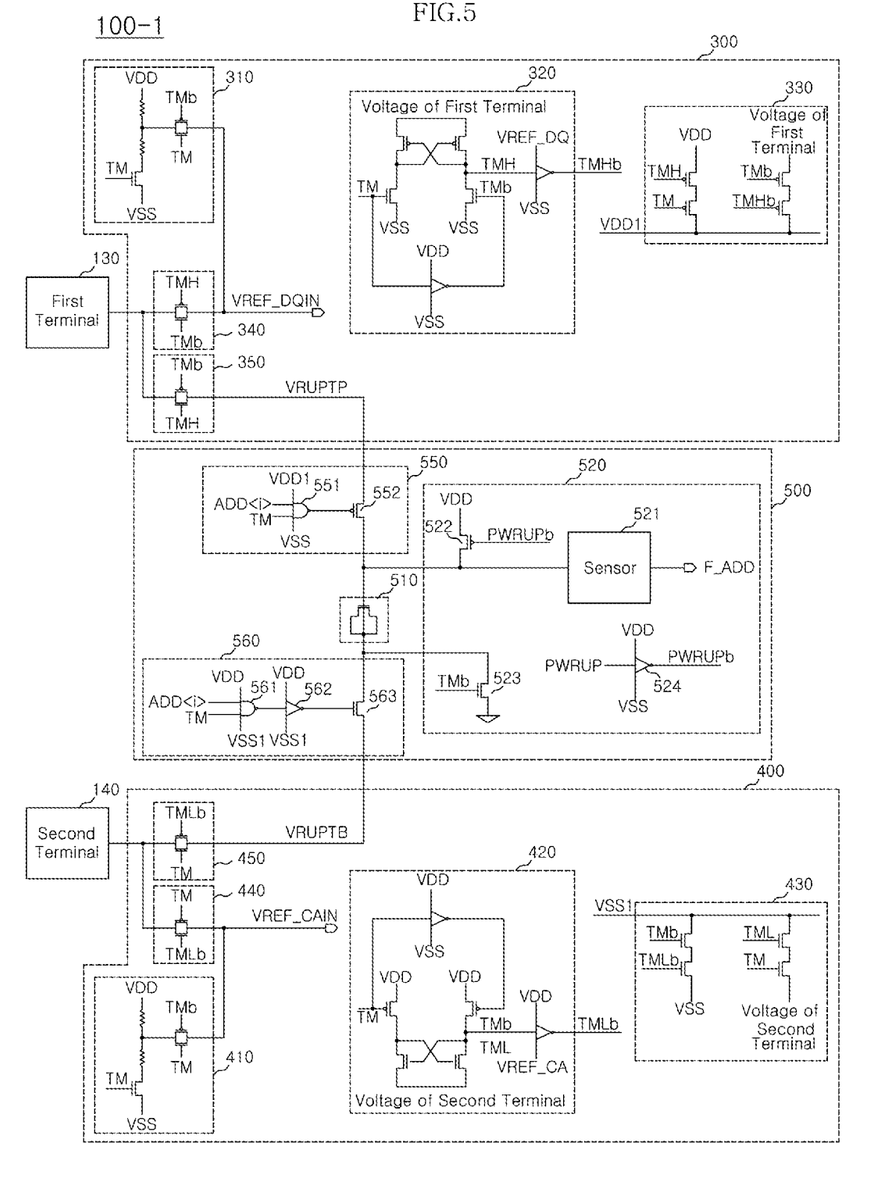
FIGS. 5 to 7 are circuit diagrams of exemplary embodiments of the semiconductor integrated circuit shown in FIG. 4.

FIG. 5 is a circuit diagram of an exemplary embodiment 100-1 of the semiconductor integrated circuit 100 shown in FIG. 4.

Referring to FIG. 5, the first control unit 300 includes a floating preventing section 310, a level shifter 320, an internal voltage generating section 330, and a plurality of switches 340 and 350.

The floating preventing section 310 may prevent a first reference voltage terminal VREF_DQIN from being floated by applying the voltage (for example, VDD/2), generated when first and second test mode signals TM and TMb are activated, to the first reference voltage terminal VREF_DQIN.

Here, the first test mode signal TM may be defined in such a manner that it is activated when it has a logic high level and is deactivated when it has a logic low level. The second test mode signal TMb may be generated by inverting the test mode signal TM and may be defined in such a manner that it is deactivated when it has a logic high level and is activated when it has a logic low level.

The level shifter 320 is configured to generate third and fourth test mode signals TMH and TMHb in response to the first and second test mode signals TM and TMb.

The level shifter 320 generates the third and fourth test mode signals TMH and TMHb using a ground voltage VSS and a voltage applied to a first terminal 130.

The third test mode signal TMH is a signal which has substantially the same phase as the first test mode signal TM and has a larger voltage level than the first test mode signal TM. The fourth test mode signal TMHb is a signal which may be generated by inverting the third test mode signal TMH.

For example, if the first test mode signal TM has a level between the ground voltage VSS and an external voltage VDD, the third test mode signal TMH may have a level between the ground voltage VSS and the first rupture bias voltage VRUPTP.

The internal voltage generating section 330 is configured to output the external voltage VDD or the voltage of the first terminal 130 as the internal voltage VDD1 in response to the test mode signals TM, TMb, TMH and TMHb.

The internal voltage generating section 330 outputs the voltage of the first terminal 130 as the internal voltage VDD1 when the third and first test mode signals TMH and TM are activated. At this time, when the test mode signals TMH and TM are activated, the first rupture bias voltage VRUPTP may be inputted through the first terminal 130. Therefore, when the test mode signals TMH and TM are activated, the voltage value of the internal voltage VDD1 is substantially the same as the first rupture bias voltage VRUPTP.

The internal voltage generating section 330 outputs the external voltage VDD as the internal voltage VDD1 when the third and first test mode signals TMH and TM are deactivated.

The switch 340 transmits a first reference voltage VREF_DQ, inputted through the first terminal 130, to the buffer 110 when the test mode signal TMH is deactivated.

The switch 350 transmits the first rupture bias voltage VRUPTP, inputted through the first terminal 130, to the fuse set 500 when the test mode signal TMH is activated.

The second control unit 400 includes a floating preventing section 410, a level shifter 420, an internal voltage generating section 430, and a plurality of switches 440 and 450.

The floating preventing section 410 may prevent a second reference voltage terminal VREF_CAIN from being floated by applying the voltage (for example, VDD/2), generated when the first and second test mode signals TM and TMb are activated, to the second reference voltage terminal VREF_CAIN.

The level shifter 420 is configured to generate fifth and sixth test mode signals TML and TMLb in response to the first and second test mode signals TM and TMb.

The level shifter 420 generates the fifth and sixth test mode signals TML and TMLb using the external voltage VDD and a voltage applied to a second terminal 140.

The fifth test mode signal TML is a signal which has substantially the same phase as the first test mode signal TM and has a smaller voltage level than the first test mode signal TM. The sixth test mode signal TMLb is a signal which may be generated by inverting the fifth test mode signal TML.

For example, if the first test mode signal TM has a level between the external voltage VDD and the ground voltage VSS, the fifth test mode signal TML may have a level between the external voltage VDD and the second rupture bias voltage VRUPTB.

The first and second test mode signals TM and TMb, which are provided from an outside, may be referred to as external test mode signals. On the other hand, the test mode signals TMH, TMHb, TML and TMLb, which are generated internally, may be referred to as internal test mode signals.

The internal voltage generating section 430 is configured to output the ground voltage VSS or the voltage of the second terminal 140 as the internal voltage VSS1 in response to the test mode signals TM, TMb, TML and TMLb.

The internal voltage generating section 430 outputs the voltage of the second terminal 140 as the internal voltage VSS1 when the fifth and first test mode signals TML and TM are activated. At this time, when the test mode signals TML and TM are activated, the second rupture bias voltage VRUPTB may be inputted through the second terminal 140. Therefore, when the test mode signals TML and TM are activated, the voltage value of the internal voltage VSS1 is substantially the same as the second rupture bias voltage VRUPTB.

The internal voltage generating section 430 outputs the ground voltage VSS as the internal voltage VSS1 when the fifth and first test mode signals TML and TM are deactivated.

The switch 440 transmits a second reference voltage VREF_CA, inputted through the second terminal 140, to the buffer 120 when the test mode signal TM is deactivated.

The switch 450 transmits the second rupture bias voltage VRUPTB, inputted through the second terminal 140, to the fuse set 500 when the test mode signal TM is activated.

The fuse set 500 includes a fuse 510, a fuse state detecting section 520, and a plurality of switches 550 and 560.

FIG. 5 shows a fuse 510 among a plurality of fuses included in the fuse set 500 and circuit components 520, 550 and 560.

Here, an electronic fuse may be used as the fuse 510.

The fuse state detecting section 520 is configured to determine whether or not rupture of the fuse 510 has normally occurred and generate a fuse state signal F_ADD.

The fuse state detecting section 520 includes a sensor 521, transistors 522 and 523 and an inverter 524.

The transistor 522 precharges the gate (hereinafter, referred to as one end) of the fuse 510 to the level of the external voltage VDD in response to activation of the power-up signal PWRUP.

The transistor 523 electrically connects the terminal of the fuse 510 to which a source, a drain and a bulk are connected (hereinafter, referred to as the other end) (see FIG. 1) to a ground terminal after the fuse rupture operation, that is, after deactivation of the test mode signal TM.

If the rupture of the fuse 510 has normally occurred, the one end and the other end of the fuse 510 are electrically connected with each other. Accordingly, the voltage level of the fuse 510 will be lowered.

However, if the rupture of the fuse 510 has not normally occurred, the one end and the other end of the fuse 510 are not electrically connected with each other, otherwise, even though they are electrically connected with each other, the voltage level of the fuse 510 may not be appropriately lowered when compared to a normal case.

Accordingly, the sensor 521 may determine whether or not is the rupture of the fuse 510 has normally occurred, depending upon a change in the voltage level of the gate of the fuse 510, and generate the fuse state signal F_ADD as a determination result.

The plurality of switches 550 and 560 are configured to apply the first and second rupture bias voltages VRUPTP and VRUPTB to the fuse 510 in response to the test mode signal TM and a fuse address signal ADD<i> (i is one of 0 to N).

The fuse address signal ADD<i> is an address signal for selecting the fuse 510.

The switch 550 applies the first rupture bias voltage VRUPTP to the one end of the fuse 510 only when both the test mode signal TM and the fuse address signal ADD<i> are activated.

The switch 550 includes a NAND gate 551 and a transistor 552.

The switch 560 applies the second rupture bias voltage VRUPTB to the other end of the fuse 510 only when both the test mode signal TM and the fuse address signal ADD<i> are activated.

The switch 560 includes a NAND gate 561, an inverter 562 and a transistor 563.

In an embodiment of the present invention, as a difference between the first and second rupture bias voltages VRUPTP and VRUPTB applied to both ends of the fuse 510 increases, the rupture of the fuse 510 may stably occur.

A voltage higher than the pumping voltage VPP may be applied as the first rupture bias voltage VRUPTP, and a negative voltage lower than the bulk bias voltage VBB may be applied as the second rupture bias voltage VRUPTB.

In an embodiment of the present invention, the first and second rupture bias voltages VRUPTP and VRUPTB are not applied to the buffers 110 and 120 in the fuse rupture operation.

Accordingly, in order to secure the off characteristics of the pass gates constituting the switches 340 and 350, the test mode signal TMH, which has a larger voltage level than the test mode signal TM, may be applied to the gates of the switches 340 and 350.

Further, in order to secure the off characteristics of the pass gates constituting the switches 440 and 450, the test mode signal TML, which has a smaller voltage level than the test mode signal TM, may be applied to the gates of the switches 440 and 450.

Similarly, in order to secure the off characteristics of the transistor 552 of the switch 550, the internal voltage VDD1 with the level of the first rupture bias voltage VRUPTP instead of the external voltage VDD may be applied to the power source terminal of the NAND gate 551.

Further, in order to secure the off characteristics of the transistor 563 of the switch 560, the internal voltage VDD1 with the level of the second rupture bias voltage VRUPTB instead of the ground voltage VSS may be applied to the ground terminals of the NAND gate 561 and the inverter 562.

Figure 6:
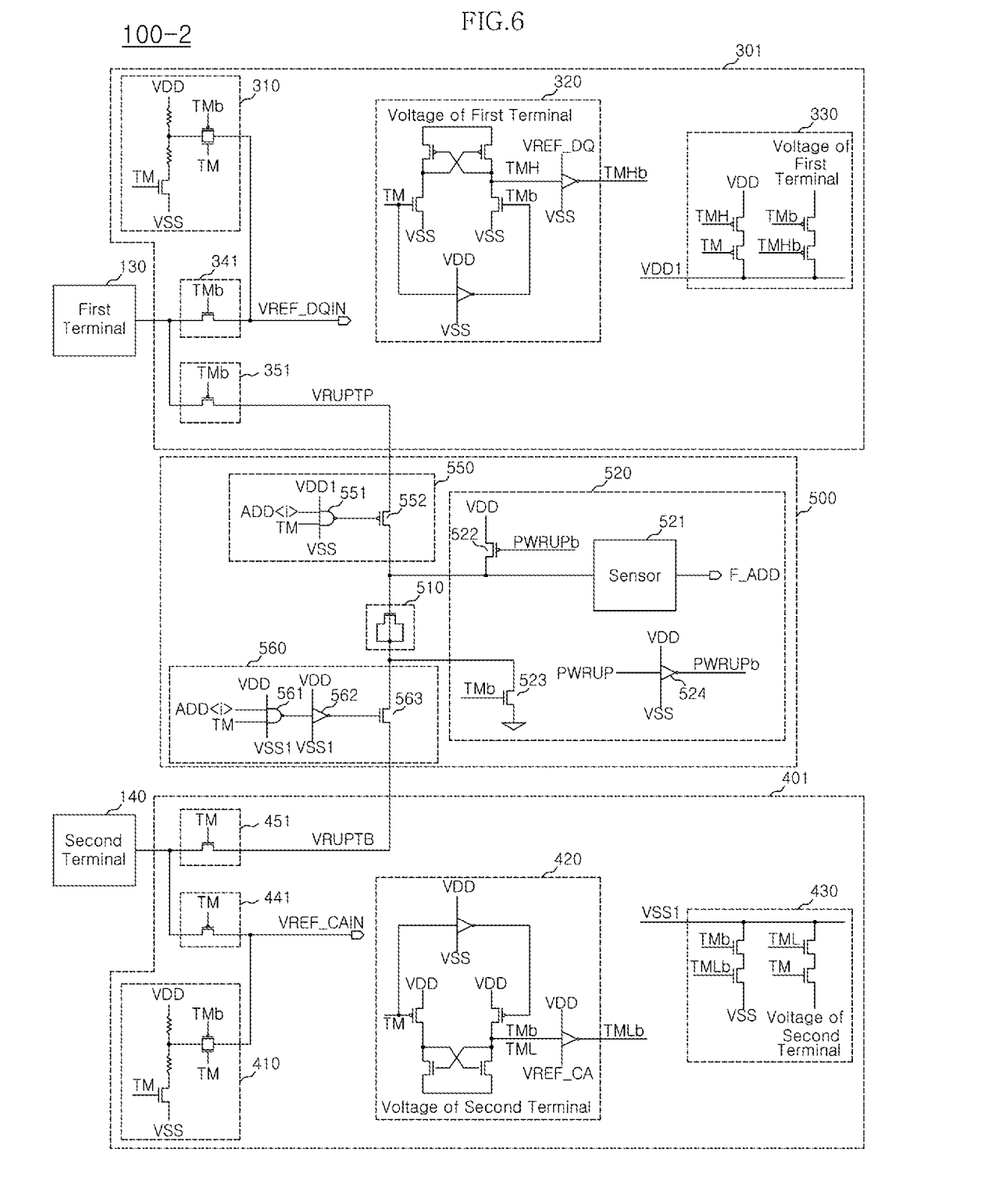

FIG. 6 is a circuit diagram of an exemplary embodiment 100-2 of the semiconductor integrated circuit 100 shown in FIG. 4.

Referring to FIG. 6, the semiconductor integrated circuit 100-2 includes a first control unit 301, a second control unit 401, and a fuse set 500.

The first control unit 301 includes a floating preventing section 310, a level shifter 320, an internal voltage generating section 330, and a plurality of switches 341 and 351.

The plurality of switches 341 and 351 are constituted by transistors and are controlled by a second test mode signal TMb.

The floating preventing section 310, the level shifter 320 and the internal voltage generating section 330 may be configured in the same manner as in FIG. 5.

The second control unit 401 includes a floating preventing section 410, a level shifter 420, an internal voltage generating section 430, and a plurality of switches 441 and 451.

The plurality of switches 441 and 451 are constituted by transistors and are controlled by a first test mode signal TM.

The floating preventing section 410, the level shifter 420 and the internal voltage generating section 430 may be configured in the same manner as in FIG. 5.

The fuse set 500 may be configured in the same manner as to in FIG. 5.

Figure 7:
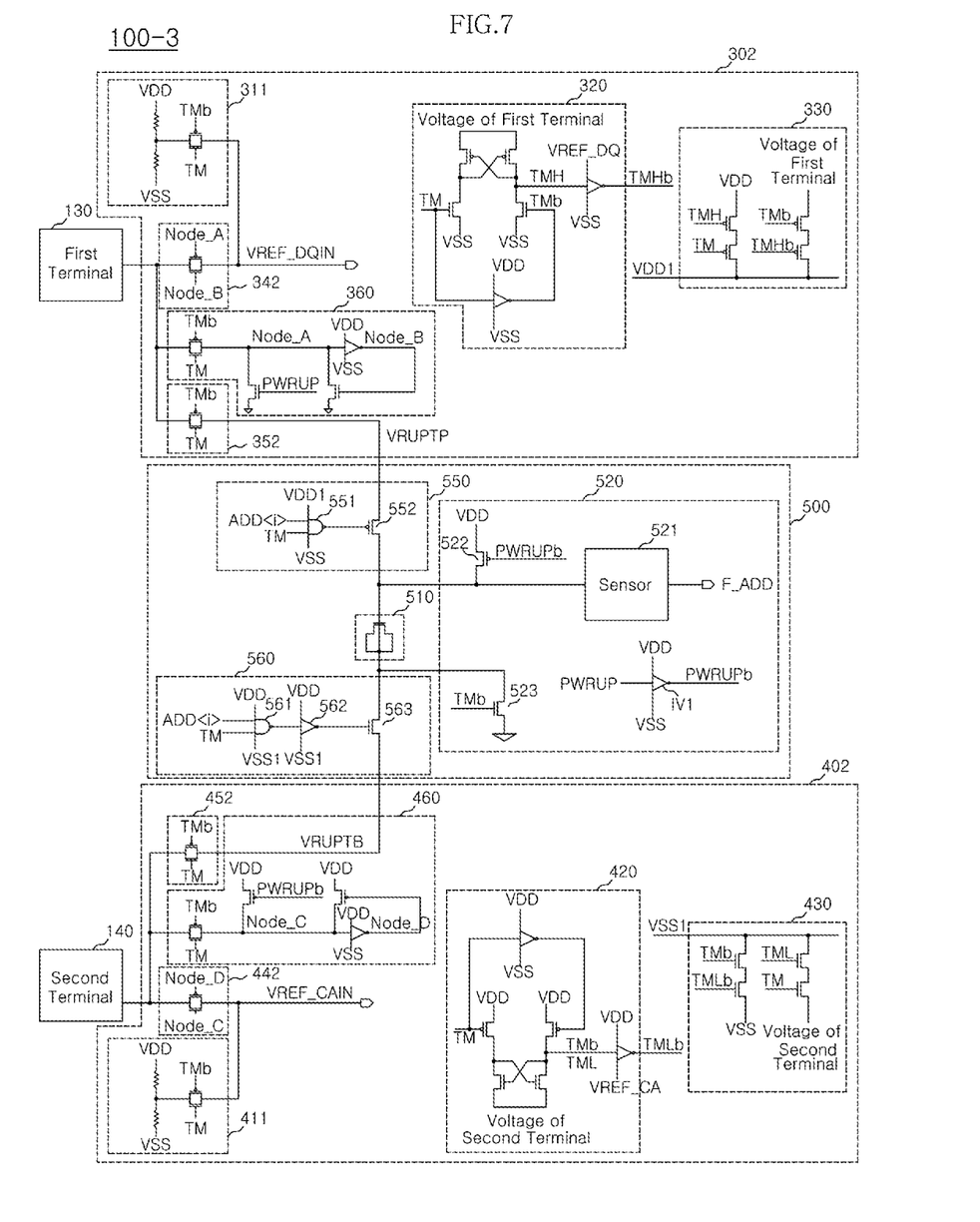

FIG. 7 is a circuit diagram of an exemplary embodiment 100-3 of the semiconductor integrated circuit 100 shown in FIG. 4.

Referring to FIG. 7, the semiconductor integrated circuit 100-3 includes a first control unit 302, a second control unit 402, and is a fuse set 500.

The first control unit 302 includes a floating preventing section 311, a level shifter 320, an internal voltage generating section 330, a plurality of switches 342 and 352, and a feedback circuit section 360.

The feedback circuit section 360 is configured to maintain, through feedback, node voltages Node_A and Node_B generated in response to the power-up signal PWRUP. At this time, the first test mode signal TM is in a deactivated state.

The feedback circuit section 360 is configured to change the levels of the node voltages Node_A and Node_B using a first rupture bias voltage VRUPTP which is inputted in response to activation of the first test mode signal TM.

The switch 342 is controlled by the node voltages Node_A and Node_B.

The switch 352 is controlled by the first and second test mode signals TM and TMb.

The level shifter 320 and the internal voltage generating section 330 may be configured in the same manner as in FIG. 5.

The second control unit 402 includes a floating preventing section 411, a level shifter 420, an internal voltage generating section 430, a plurality of switches 442 and 452, and a feedback circuit section 460.

The feedback circuit section 460 is configured to maintain, through feedback, node voltages Node_C and Node_D generated in response to a power-up signal PWRUPb. At this time, the first test mode signal TM is in a deactivated state.

The feedback circuit section 460 is configured to change the levels of the node voltages Node_C and Node_D using the second rupture bias voltage VRUPTB which is inputted in response to activation of the first test mode signal TM.

The switch 442 is controlled by the node voltages Node_C and Node_D.

The switch 452 is controlled by the first and second test mode signals TM and TMb.

The level shifter 420 and the internal voltage generating section 430 may be configured in the same manner as in FIG. 5.

The fuse set 500 may be configured in the same manner as in FIG. 5.

Figure 8:
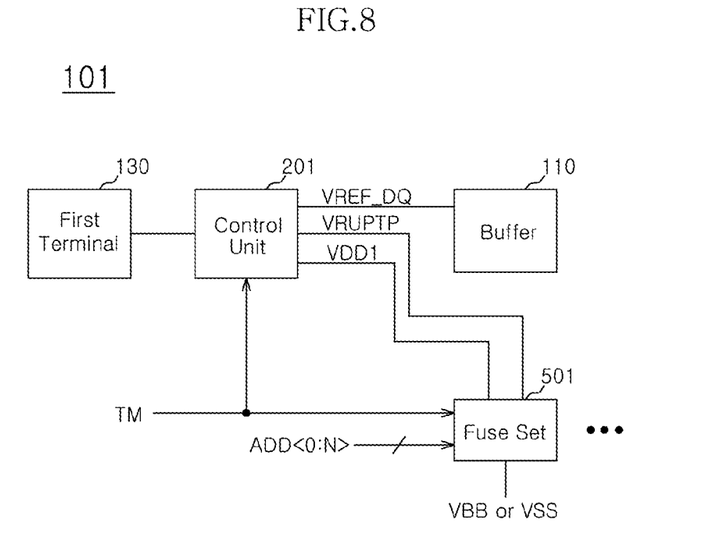
FIG. 8 is a block diagram showing a semiconductor integrated circuit in accordance with an embodiment of the present invention.

In a semiconductor integrated circuit 101 in accordance with an embodiment of the present invention shown in FIG. 8, a first terminal 130, which is used to supply a reference voltage in a normal operation, may be used to receive a first rupture bias voltage VRUPTP which is applied to one end of a fuse in a fuse rupture operation. As the voltage applied to the other end of the fuse, a ground voltage VSS, (or VBB) which is to be used in a normal operation, may be used.

Referring to FIG. 8, the semiconductor integrated circuit 101 in accordance with an embodiment of the present invention includes a first terminal 130, a control unit 201, and a fuse set 501.

The semiconductor integrated circuit 101 may further include a buffer 110.

The buffer 110 may buffer a first reference voltage VREF_DQ and provide the first reference voltage VREF_DQ to a circuit component (not shown) which is to receive data.

Figure 9:
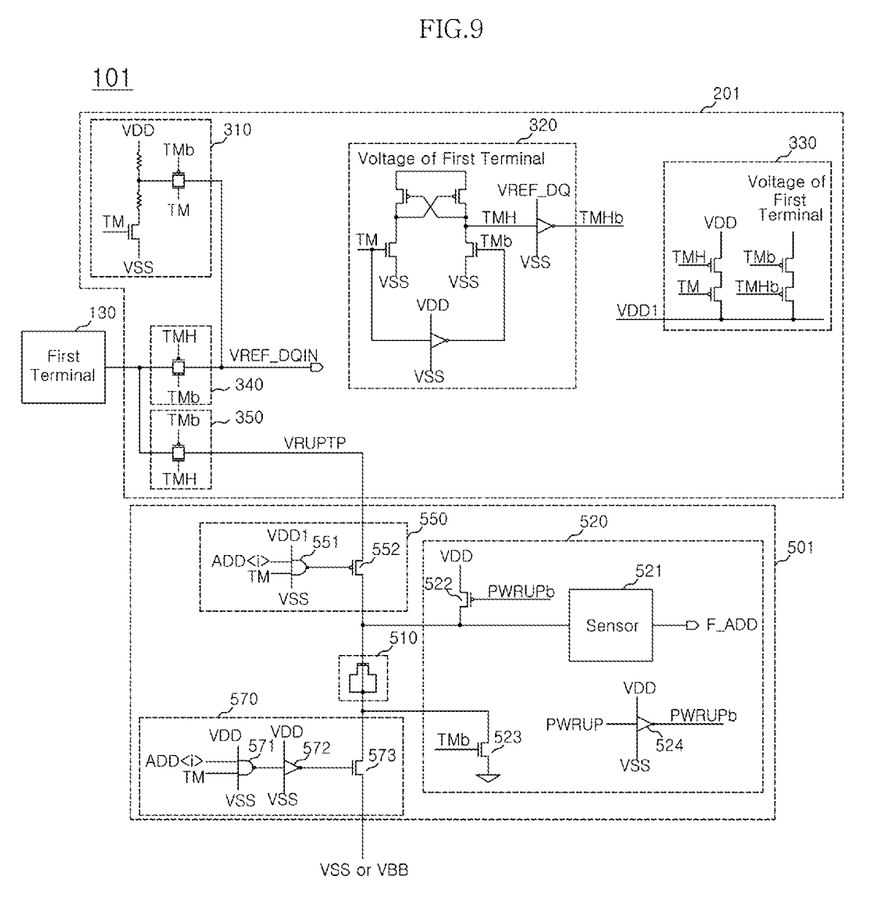
FIG. 9 is a circuit diagram of the semiconductor integrated circuit shown in FIG. 8.

Referring to FIG. 9, the control unit 201 includes a floating preventing section 310, a level shifter 320, an internal voltage generating section 330, and a plurality of switches 340 and 350, and may be configured in the same manner as the first control unit 300 shown in FIG. 5.

The fuse set 501 includes a fuse 510, a fuse state detecting section 520, and a plurality of switches 550 and 570.

The switch 570 includes a NAND gate 571, an inverter 572, and a transistor 573.

In the switch 570, since the NAND gate 571 and the inverter 572 function to control the transistor 573 for applying the ground voltage VSS (or VBB) to the fuse 510, they receive an external voltage VDD and the ground voltage VSS (or VBB) as power supply voltages.

The fuse 510, the fuse state detecting section 520 and the switch 550 may be configured in the same manner as in FIG. 5.

Figure 10:
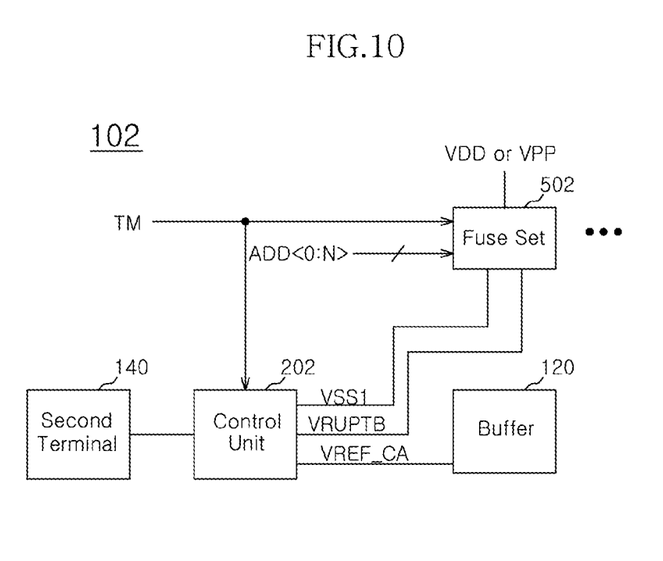
FIG. 10 is a block diagram showing a semiconductor integrated circuit in accordance with an embodiment of the present invention.

In a semiconductor integrated circuit 102 in accordance with an embodiment of the present invention shown in FIG. 10, a second terminal 140, which is used to supply a reference voltage in a normal operation, may be used to receive a second rupture bias voltage VRUPTB which is applied to the other end of the a fuse in a fuse rupture operation. Also, as the voltage applied to one end of the fuse, an external voltage VDD (or VPP) which is to be used in a normal operation, may be used.

Referring to FIG. 10, the semiconductor integrated circuit 102 in accordance with an embodiment of the present invention includes a second terminal 140, a control unit 202, and a fuse set 502.

The semiconductor integrated circuit 102 may further include a buffer 120.

The buffer 120 may buffer a second reference voltage VREF_CA and provide the second reference voltage VREF_CA to a circuit component (not shown) which is to receive data.

Figure 11:
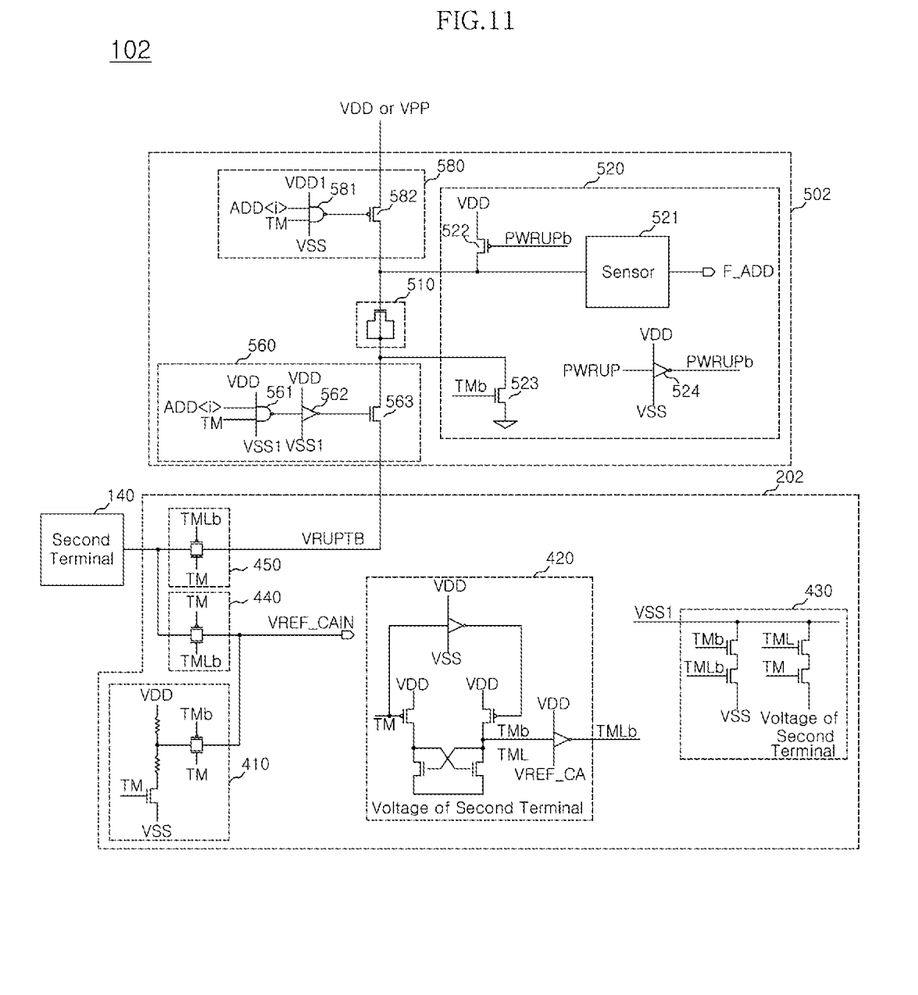
FIG. 11 is a circuit diagram of the semiconductor integrated circuit shown in FIG. 10.

Referring to FIG. 11, the control unit 202 includes a floating preventing section 410, a level shifter 420, an internal voltage generating section 430, and a plurality of switches 440 and 450, and may be configured in the same manner as the second control unit 400 shown in FIG. 5.

The fuse set 502 includes a fuse 510, a fuse state detecting section 520, and a plurality of switches 560 and 580.

The switch 580 includes a NAND gate 581 and a transistor 582.

In the switch 580, since the NAND gate 581 functions to control the transistor 582 for applying the external voltage VDD (or VPP) to the fuse 510, the NAND gate 581 receives the external voltage VDD (or VPP) and a ground voltage VSS as power supply voltages.

The fuse 510, the fuse state detecting section 520 and the switch 550 may be configured in the same manner as in FIG. 5.

In the embodiments of the present invention shown in FIGS. 5 to 11, it was described that the switches 550, 551, 560 and 561 and the fuse state detecting section 520 are included in the fuse sets 500, 501 and 502.

However, such examples are only for an illustration purpose. Therefore, when considering functional aspects and changes in a circuit design, it is conceivable that the switches 550, 551, 560 and 561 and the fuse state detecting section 520 may be included in the control units 200, 201 and 202.

As is apparent from the above descriptions, in the embodiments of the present invention, without additionally forming or assigning terminals, it is possible to provide stable rupture bias voltages to a fuse.

While certain embodiments have been described above, it will be understood to those skilled in the art that the embodiments described are by way of example only. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:

1. A semiconductor integrated circuit comprising:
   a fuse set;
   a terminal; and
   a control unit configured to receive a second external signal through the terminal and apply the received second external signal to the fuse set in a fuse control operation, and receive a first external signal through the terminal and apply the first external signal to a circuit component set in a normal operation,
   wherein the first external signal and the second external signal are provided from an outside of the semiconductor integrated circuit,
   wherein the first external signal comprises a reference voltage used for determining respective values of data and address inputted to the semiconductor integrated circuit.

2. The semiconductor integrated circuit according to claim 1, wherein the control unit configured to apply the second external signal to a fuse selected in the fuse set, in response to a fuse address signal and a test mode signal.

3. The semiconductor integrated circuit according to claim 1, wherein the second external signal comprises a rupture bias voltage.

4. The semiconductor integrated circuit according to claim 1, wherein the control unit is configured to electrically connect the terminal with the circuit component set to use the first external signal or with the fuse set, in response to a test mode signal.

5. The semiconductor integrated circuit according to claim 1, further comprising:
   buffers configured to receive the first external signal.

6. The semiconductor integrated circuit according to claim 1, wherein the control unit comprises:
   a first switch configured to electrically connect the terminal with the circuit component set in response to deactivation of a test mode signal; and
   a second switch configured to electrically connect the terminal with the fuse set in response to activation of the test mode signal.

7. The semiconductor integrated circuit according to claim 6, wherein the control unit further comprises:
   a third switch configured to apply the second external signal to a fuse selected in the fuse set, in response to a fuse address signal and the test mode signal.

8. The semiconductor integrated circuit according to claim 7, wherein the control unit further comprises:

a floating preventing section configured to apply a preset voltage to the buffers in response to the test mode signal.

9. The semiconductor integrated circuit according to claim 6, wherein an activation voltage level of the test mode signal is substantially the same as a voltage level of the second external signal.

10. The semiconductor integrated circuit according to claim 9, wherein the control unit further comprises:
a level shifter configured to shift a voltage level of an external test mode signal to substantially the same level as the voltage level of the second external signal and output the level-shifted signal as the test mode signal.

11. The semiconductor integrated circuit according to claim 7, wherein the third switch is controlled by an internal voltage which has substantially the same voltage level as the second external signal.

12. The semiconductor integrated circuit according to claim 11, wherein the control unit further comprises:
a level shifter configured to shift a voltage level of an external test mode signal to substantially the same level as the voltage level of the second external signal and output the level-shifted signal as the test mode signal; and
an internal voltage generating section configured to generate the internal voltage in response to the external test mode signal and the test mode signal.

13. A semiconductor integrated circuit comprising:
a fuse set;
a first terminal;
a first control unit configured to receive a second external signal through the first terminal and apply the received second external signal to the fuse set in a fuse rupture operation, and receive a first external signal through the terminal and apply the first external signal to a first buffer in a normal operation;
a second terminal; and
a second control unit configured to receive a fourth external signal through the second terminal and apply the received fourth external signal to the fuse set in the fuse rupture operation, and receive a third external signal through the terminal and apply the third external signal to a second buffer in a normal operation,
wherein the first external signal comprises a reference voltage used for determining respective values of data and address inputted to the semiconductor integrated circuit.

14. The semiconductor integrated circuit according to claim 13, wherein the first control unit configured to apply the second external signal to a fuse selected in the fuse set, in response to a fuse address signal and a test mode signal.

15. The semiconductor integrated circuit according to claim 13, wherein the second external signal comprises a rupture bias voltage.

16. The semiconductor integrated circuit according to claim 13, wherein the first control unit comprises:
a first switch configured to electrically connect the first terminal with the first buffer in response to deactivation of an internal test mode signal; and
a second switch configured to electrically connect the first terminal with the fuse set in response to activation of the internal test mode signal.

17. The semiconductor integrated circuit according to claim 16, wherein the first control unit further comprises:
a third switch configured to apply the second external signal to a fuse selected in the fuse set, in response to a fuse address signal and an external test mode signal.

18. The semiconductor integrated circuit according to claim 17, wherein an activation voltage level of the internal test mode signal is substantially the same as a voltage level of the second external signal.

19. The semiconductor integrated circuit according to claim 18, wherein the first control unit further comprises:
a level shifter configured to shift a voltage level of the external test mode signal to substantially the same level as the voltage level of the second external signal and output the level-shifted signal as the internal test mode signal.

20. The semiconductor integrated circuit according to claim 17, wherein the third switch is controlled by an internal voltage which has substantially the same voltage level as the second external signal.

21. The semiconductor integrated circuit according to claim 20, wherein the first control unit further comprises:
a level shifter configured to shift a voltage level of the external test mode signal to substantially the same level as the voltage level of the second external signal and output the level-shifted signal as the internal test mode signal; and
an internal voltage generating section configured to generate the internal voltage in response to the external test mode signal and the internal test mode signal.

22. The semiconductor integrated circuit according to claim 15, wherein the second control unit comprises:
a first switch configured to electrically connect the second terminal with the second buffer in response to deactivation of an internal test mode signal; and
a second switch configured to electrically connect the second terminal with the fuse set in response to activation of the internal test mode signal.

23. The semiconductor integrated circuit according to claim 22, wherein the second control unit further comprises:
a third switch configured to apply the fourth external signal to a fuse selected in the fuse set, in response to a fuse address signal and an external test mode signal.

24. The semiconductor integrated circuit according to claim 23, wherein an activation voltage level of the internal test mode signal is substantially the same as a voltage level of the fourth external signal.

25. The semiconductor integrated circuit according to claim 24, wherein the second control unit further comprises:
a level shifter configured to shift a voltage level of the external test mode signal to substantially the same level as the voltage level of the fourth external signal and output the level-shifted signal as the internal test mode signal.

26. The semiconductor integrated circuit according to claim 23, wherein the third switch is controlled by an internal voltage which has substantially the same voltage level as the fourth external signal.

27. The semiconductor integrated circuit according to claim 26, wherein the second control unit further comprises:
a level shifter configured to shift a voltage level of the external test mode signal to substantially the same level as the voltage level of the fourth external signal and output the level-shifted signal as the internal test mode signal; and
an internal voltage generating section configured to generate the internal voltage in response to the external test mode signal and the internal test mode signal.

* * * * *